United States Patent
Hashimoto et al.

(10) Patent No.: US 9,306,047 B2
(45) Date of Patent: Apr. 5, 2016

(54) SEMICONDUCTOR DEVICE AND ELECTRIC POWER CONVERTER IN WHICH SAME IS USED

(71) Applicant: Hitachi, Ltd., Chiyoda-ku, Tokyo (JP)

(72) Inventors: Takayuki Hashimoto, Tokyo (JP); Mutsuhiro Mori, Tokyo (JP); Masahiro Masunaga, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/433,436

(22) PCT Filed: Oct. 5, 2012

(86) PCT No.: PCT/JP2012/075887
§ 371 (c)(1),
(2) Date: Apr. 3, 2015

(87) PCT Pub. No.: WO2014/054162
PCT Pub. Date: Apr. 10, 2014

(65) Prior Publication Data
US 2015/0279979 A1     Oct. 1, 2015

(51) Int. Cl.
*H01L 29/66* (2006.01)
*H01L 29/739* (2006.01)
*H01L 29/78* (2006.01)
*H01L 29/36* (2006.01)
*H01L 29/423* (2006.01)

(52) U.S. Cl.
CPC ............ *H01L 29/7395* (2013.01); *H01L 29/36* (2013.01); *H01L 29/4236* (2013.01); *H01L 29/7397* (2013.01); *H01L 29/78* (2013.01)

(58) Field of Classification Search
CPC .................................................. H01L 29/7395
USPC ......................................................... 257/139
See application file for complete search history.

(56) References Cited

U.S. PATENT DOCUMENTS

| | | | |
|---|---|---|---|
| 5,554,862 | A | 9/1996 | Omura et al. |
| 2001/0045566 | A1 | 11/2001 | Takahashi et al. |
| 2006/0081919 | A1 | 4/2006 | Inoue et al. |

FOREIGN PATENT DOCUMENTS

| | | | |
|---|---|---|---|
| EP | 1 030 373 | A1 | 8/2000 |
| JP | 6-163908 | A | 6/1994 |
| JP | 6-275818 | A | 9/1994 |
| JP | 9-139510 | A | 5/1997 |
| JP | 2003-347549 | | 12/2003 |
| JP | 2006-120789 | A | 5/2006 |

OTHER PUBLICATIONS

International Search Report from International Patent Application No. PCT/JP2012/075887, Dec. 18, 2012.
Momota, Seiji et al., "Double Gate MOS Device Having IGBT and MCT Performances", Proc. IEEE ISPSD 92, pp. 28-33, May 1992.

*Primary Examiner* — Anthony Ho
(74) *Attorney, Agent, or Firm* — Miles & Stockbridge P.C.

(57) ABSTRACT

There is provided a semiconductor device including a first emitter layer of a first conductivity type, a drift layer of a second conductivity type, adjacent to the first emitter layer, a channel layer of the first conductivity type, adjacent to the drift layer, a second emitter layer of the second conductivity type, adjacent to the channel layer, a collector electrode electrically coupled to the first emitter layer, an emitter electrode electrically coupled to the second emitter layer, a first trench-gate electrode for controlling on and off of an electric current flowing between the collector electrode and the emitter electrode, and a second trench-gate electrode for controlling a turn-off power loss. The semiconductor device further includes a thyristor unit made up of the first emitter layer, the drift layer, the channel layer, and the second emitter layer. Further, the electric current has saturation characteristics in a short circuit state, and short circuit capability of a double-gate semiconductor switching device is improved because the magnitude of electric current flowing during a short circuit is under control due to the electric current saturation characteristics.

10 Claims, 6 Drawing Sheets

SEMICONDUCTOR DEVICE AND ELECTRIC POWER CONVERTER IN WHICH SAME IS USED

TECHNICAL FIELD

The invention relates to a semiconductor device and an electric power converter using the same, and in particular to a semiconductor device suitable for use as a semiconductor switching element, in widespread use, in fields ranging from a small electric power supply unit such as an air conditioner, a micro wave oven, etc. to a large electric power supply unit such as an inverter, etc. for use in railroads, and steel works, and an electric power converter using the semiconductor device.

BACKGROUND ART

A large number of the electric power converters, that is, inverters and converters are lately in use in the respective fields of energy conservation and new energy, however, in order to realize a low-carbon society, a marked increase in prevalent use thereof has become indispensable.

With the electric power converter, power conversion is executed by turning the semiconductor switching element ON-OFF. For the semiconductor switching element, much use is made of an IGBT (Insulated Gate Bipolar Transistor) as one type of power semiconductor element. With the semiconductor switching element such as the IGBT, etc., power dissipation occurs at the time of conduction and at the time of switching, respectively, and it is therefore necessary to reduce the power dissipation occurring to the semiconductor switching element in order to achieve miniaturization of the electric power converter, or higher efficiency thereof.

There has been proposed a double-gate semiconductor switching element provided with two units of gate electrodes (refer to Nonpatent Literature 1, and Patent Literature 1), representing a technology capable of reducing both conduction loss and switching loss. With the double-gate semiconductor switching element, a control signal is imparted to one of the gate electrodes to switch over from an IGBT operation mode to a thyristor operation mode, and vice versa, thereby reducing both a conduction loss and a switching loss.

CITATION LIST

Patent Literature

Patent Literature 1: Japanese Unexamined Patent Application Publication No. Hei 6(1944)-163908

Nonpatent Literature

Nonpatent Literature 1: S. Momota et al., "Double Gate MOS Device having IGBT and MCT performances", Proc. IEEE ISPSD '92, pp. 28-33, May 1992

SUMMARY OF INVENTION

Technical Problem

However, the present inventor, et al. have found that the semiconductor switching element according to the related art has a problem in that a short circuit capability is insufficient. The short circuit, in this case, is meant by a state in which, in the case where the output terminal of the semiconductor switching element, such as an IGBT, etc., is grounded to be thereby short-circuited to the potential of a power supply terminal, a power supply voltage is applied to the semiconductor switching element, and a saturation current controlled by a gate voltage from a gate circuit has flown to the semiconductor switching element. Since the saturation current is 5 to 10 times as large as the rated current of the semiconductor switching element, the electric power converter determines that the saturation current is an overcurrent to thereby cut off the saturation current after the elapse of predetermined time. Accordingly, the semiconductor switching element needs to prevent a parasitic thyristor incorporated therein from being turned into a latch-up state while withstanding Joule heat occurring due to the power supply voltage, and the saturation current, respectively, during the predetermined time. The short circuit capability described as above can be expressed by use of a time length up to a breakdown reached at the time when a short circuit current is caused to flow to the semiconductor switching element (refer to, for example, Japanese Unexamined Patent Application Publication No. Hei 2003-347549).

FIG. 5 shows output characteristic of the double-gate semiconductor switching element described as above. With the double-gate semiconductor switching element, switch-over from a thyristor mode to an IGBT mode, and vice versa can be effected by controlling a MOS gate. In other words, when the semiconductor switching element is in a conduction state, the thyristor mode is adopted to thereby reduce a conduction loss and when the semiconductor switching element is turned OFF, the IGBT mode is adopted to thereby reduce a switching loss.

According to the results of studies on the short circuit capability, carried out by the present inventor, et al., it has turned out that the parasitic thyristor is susceptible to operate and it is therefore difficult to secure the short circuit capability as desired. More specifically, with the double-gate semiconductor switching element, it has turned out that a parasitic thyristor is insusceptible to latch up at a normal output characteristic (a collector voltage at 10V or lower, and a collector current 1000 A or less), however, the parasitic thyristor is susceptible to latch up in a short circuit state (the collector voltage at 100V or higher, and the collector current 1000 A or more).

The present invention has been developed in view of the problems described in the foregoing, and it is an object of the invention to improve the short circuit capability of a double-gate semiconductor switching element.

Solution to Problem

In order to solve the problems described in the foregoing, a double-gate type semiconductor device according to the present invention has electric current saturation characteristics in a short circuit state, while provided with a thyristor unit. Further, according to one aspect of the present invention, there is provided a semiconductor device including a first emitter layer of a first conductivity type, a drift layer of a second conductivity type, adjacent to the first emitter layer, a channel layer of the first conductivity type, adjacent to the drift layer, a second emitter layer of the second conductivity type, adjacent to the channel layer, a collector electrode electrically coupled to the first emitter layer, an emitter electrode electrically coupled to the second emitter layer, a first trench-gate electrode for controlling on and off of an electric current flowing between the collector electrode and the emitter electrode, and a second trench-gate electrode for controlling a turn-off power loss. Further, the semiconductor device includes a thyristor unit made up of the first emitter layer, the drift layer, the channel layer, and the second emitter layer, and the electric current has saturation characteristics in a short circuit state. In this connection, the first conductivity type, and the second conductivity type are either of the so-called p-type and n-type, expressing conductivity types, mutually opposed to each other in function.

Thus, power loss occurring to the semiconductor device, at the time of conduction, can be reduced by the thyristor unit, and the magnitude of electric current flowing at the time of short circuit is controlled due to the electric current saturation characteristics, while the thyristor unit is provided, so that the short circuit capability of a double-gate type semiconductor device can be improved.

According to a more specific aspect of the present invention, in order to provide the saturation electric current characteristics, a transistor made up of the first emitter layer, the drift layer, and the channel layer has a first current amplification factor, whereas a transistor made up of the second emitter layer, the channel layer, and the drift layer has a second current amplification factor, and the sum of the first current amplification factor and the second current amplification factor is less than 1.

Preferably, an off-gate voltage signal may be imparted to the second trench-gate electrode before the off-gate voltage signal is imparted to the first trench-gate electrode at the time when the semiconductor device is turned off. By so doing, the total amount of carriers accumulated in the semiconductor device can be reduced, thereby enabling a turn-off power loss to be reduced.

Advantageous Effects of Invention

As described in the foregoing, the invention can provide the double-gate type semiconductor device low in loss and high in short circuit capability.

DESCRIPTION OF EMBODIMENTS

Embodiments of the invention are described below with reference to the accompanying drawings.

Embodiment 1

Figure 1:
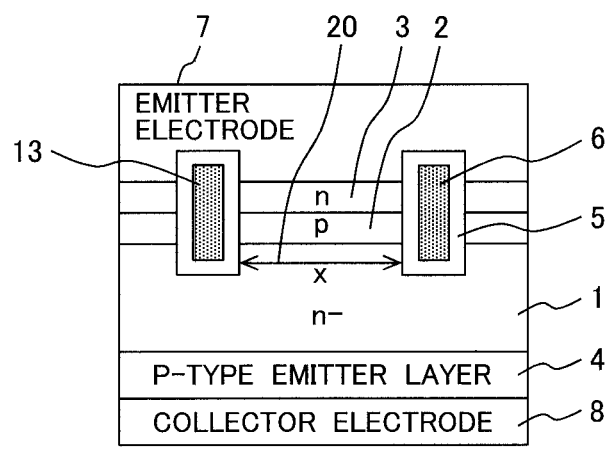
FIG. 1 is a sectional view of a semiconductor device according to Embodiment 1 of the present invention.

FIG. 1 is a sectional view of a semiconductor device according to Embodiment 1 of the present invention. The present embodiment represents a double-gate semiconductor switching element provided with a p-type emitter layer 4, an n-type drift layer 1 (n−), adjacent to the p-type emitter layer 4, a p-type channel layer 2 adjacent to the n-type drift layer 1, and an n-type emitter layer 3 adjacent to the p-type channel layer 2. The p-type emitter layer 4, the n-type drift layer 1 (n−), the p-type channel layer 2, and the n-type emitter layer 3 are each made of single crystal silicon, thereby forming a pnpn structure, that is, a parasitic thyristor.

There is formed a trench 50 starting from the surface of the n-type emitter layer 3 to reach the interior of the n-type drift layer 1 via the p-type channel layer 2. A first trench-gate electrode 6, and a second trench-gate electrode 13 are provided inside the trench 50 through a gate insulator film 5 (for example, a silicon oxide film). The first trench-gate electrode 6, and the second trench-gate electrode 13 are separated from each other, and each individual gate-voltage signal can be imparted to the first trench-gate electrode 6, and the second trench-gate electrode 13, respectively. Further, with the present embodiment, a collector electrode 8 and an emitter electrode 7 are electrically coupled to the p-type emitter layer 4 and the n-type emitter layer 3, respectively, by ohmic contact. In FIG. 1, the emitter electrode 7 is coupled to the n-type emitter layer 3 only, however, a short circuit emitter structure in which the emitter electrode 7 is partially coupled to the p-type channel layer 2 may be used.

Now, in FIG. 1, "n−" indicates that a dopant dose is relatively lower than the case of "p, n", and sign 20 indicates a width x of silicon present between the first trench-gate electrode 6, and the second trench-gate electrode 13.

The p-type channel layer 2 and the n-type emitter layer 3 are positioned between the first trench-gate electrode 6, and the second trench-gate electrode 13. The first trench-gate electrode 6 forms an n-type inversion layer in the p-type channel layer 2, thereby controlling ON and OFF of a collector current. The second trench-gate electrode 13 forms a p-type inversion layer in the n-type emitter layer 3 to reduce a total amount of holes accumulated in the n-type drift layer 1, thereby controlling a turn-off power loss.

With the present embodiment, a thyristor structure made up of the p-type emitter layer 4, the n-type drift layer 1, the p-type channel layer 2, and the n-type emitter layer 3, has difficulty in latching up in a short circuit state. More specifically, the sum ($\alpha_{npn} \alpha_{pnp}$) of a common base current amplification factor $\alpha_{npn}$ of an npn transistor made up of the n-type emitter layer 3, the p-type channel layer 2, and the n-type drift layer 1, and a common base current amplification factor $\alpha_{pnp}$ of an pnp transistor made up of the p-type channel layer 2, the n-type drift layer 1, and the p-type emitter layer 4 is set to a value ($\alpha_{npn}+\alpha_{pnp}<1$) smaller than 1. By so doing, the collector current at the time of short circuit is controlled, that is, the collector current is saturated even at the time of short circuit, so that a short circuit capability as desired can be secured.

Figure 3:
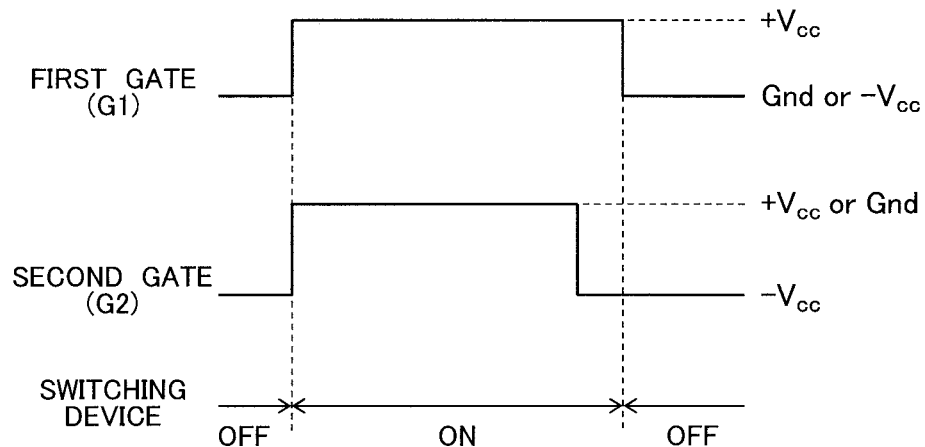
FIG. 3 is a waveform chart showing respective waveforms of a first gate voltage signal and a second gate voltage signal.

FIG. 3 shows respective waveforms of gate voltage signals, imparted to the first trench-gate electrode 6, and the second trench-gate electrode 13, respectively, according to the present embodiment.

In order to cause the semiconductor switching element according to the present embodiment to turn ON, a first gate voltage signal G1 imparted to the first trench-gate electrode 6 is set to a positive voltage against a potential of the emitter electrode 7, and a second gate voltage signal G2 imparted to the second trench-gate electrode 13 is set to a positive voltage or the same potential as that of the emitter electrode 7 (in FIG. 3, a ground potential Gnd). With the present embodiment, since the thyristor structure does not undergo latch-up in a conduction state (ON), the first gate voltage signal G1 is held at the positive voltage (ON gate) while the second gate voltage signal G2 is held at the positive voltage or the same potential as that of the emitter electrode 7. Further, because the present embodiment is provided with the thyristor structure, it is possible to reduce an on-state voltage in the conduction state.

Before the first gate voltage signal G1 imparted to the first trench-gate electrode 6 is turned OFF gate from ON gate, the second gate voltage signal G2 imparted to the second trench-gate electrode 13 is turned to a negative voltage (OFF gate) against the potential of the emitter electrode 7, whereupon a p-type accumulation layer is formed in the surface of the p-type channel layer 2 opposed by the second trench-gate electrode 13, and the p-type inversion layer is formed in the surface of the n-type emitter layer 3 opposed by the second trench-gate electrode 13. As a result, the holes accumulated in the n-type drift layer 1 are ejected to the emitter electrode 7, thereby reducing a turn-off power loss occurring to the semiconductor switching element according to the present embodiment at a time when the first gate voltage signal G1 is turned OFF.

Figure 11:
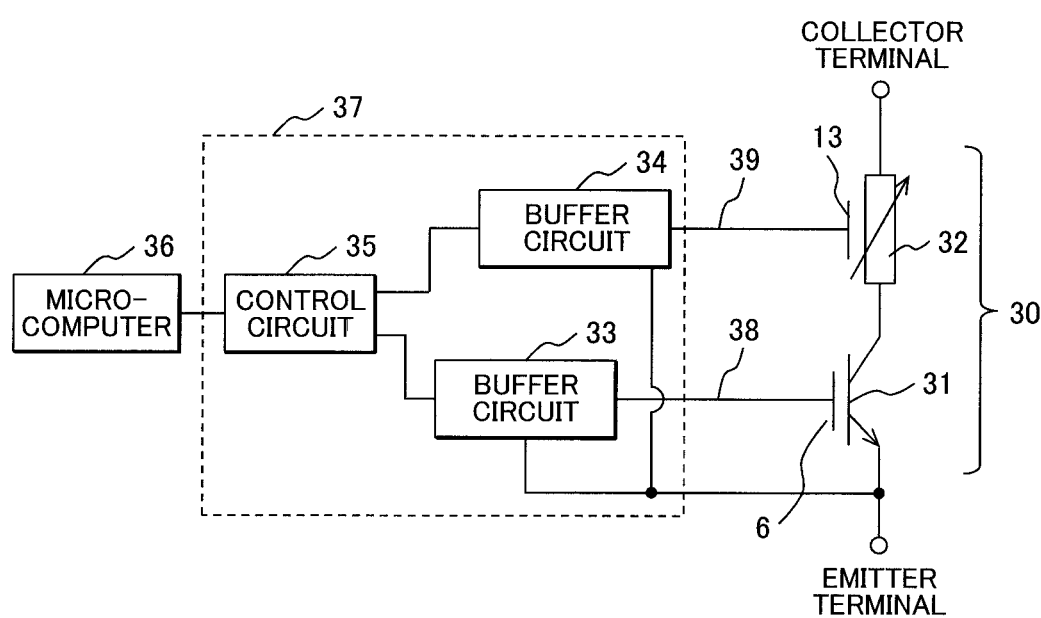
FIG. 11 is a circuit diagram of a gate-drive circuit for outputting gate voltage shown in FIG. 3.

FIG. 11 is a block diagram of a drive circuit for outputting the gate voltage signals shown in FIG. 3. Because circuit symbols for semiconductor switching element 30 are not present, a semiconductor switching element 30 in FIG. 11 is shown with the use of an IGBT 31 controlled by the first trench-gate electrode 6 and a variable resistor connected in series thereto to be controlled by the second trench-gate electrode 13, for convenience's sake. A drive circuit 37 includes a buffer circuit 33 for outputting a first gate voltage signal 38 to the first trench-gate electrode 6, a buffer circuit 34 for outputting a second gate voltage signal 39 to the second trench-gate electrode 13, and a control circuit 35 for outputting a drive signal to the buffer circuit 33, and the buffer circuit 34, respectively. The control circuit 35 outputs a drive signal on the basis of a control signal delivered from a microcomputer (abbreviated as "micon", in FIG. 11) 36. In FIG. 11 the variable resistor 32 indicates that an amount of holes accumulated is controlled by the second gate voltage signal. Time difference in OFF signal between the first gate voltage signal and the second gate voltage signal, at a turn-OFF time, shown in FIG. 3, is set by the control circuit 35.

Embodiment 2

With the semiconductor device according to Embodiment 1 described as above, $(\alpha_{npn}+\alpha_{pnp}<1)$ is set in order to secure the short circuit capability as desired, thereby controlling the latch-up. In the case of a semiconductor device according to Embodiment 2 of the present invention, described below, $\alpha_{npn}$ or $\alpha_{pnp}$ is reduced as follows in order that $(\alpha_{npn}+\alpha_{pnp}<1)$ is set.

In order to reduce a current amplification factor $\alpha_{npn}$ of the npn transistor made up of the n-type emitter layer 3, the p-type channel layer 2, and the n-type drift layer 1, it is effective to reduce the electron injection efficiency of the n-type emitter layer 3, and therefore, the n-type dopant dose in the n-type emitter layer 3 is reduced. According to studies made in connection with the present invention, in order to set $(\alpha_{npn}+\alpha_{pnp}<1)$, the peak value of a dopant dose in the n-type emitter layer 3 is preferably set to $1\times10^{18}$ cm$^{-3}$ or less.

In order to reduce a current amplification factor $\alpha_{pnp}$ of an pnp transistor made up of the p-type channel layer 2, the n-type drift layer 1, and the p-type emitter layer 4, it is effective to reduce hole-injection efficiency of the p-type emitter layer 4, and therefore, a p-type dopant dose of the p-type emitter layer 4 is reduced. According to studies carried out by the present inventor, et al., in order that $(\alpha_{npn}+\alpha_{pnp}<1)$ is set, the peak value of the p-type dopant dose in the p-type emitter layer 4 is preferably set to $1\times10^{18}$ cm$^{-3}$ or less. If the peak value of a dopant dose in either the n-type emitter layer 3 or the p-type emitter layer 4, or in both is set to $1\times10^{18}$ cm$^{-3}$ or less, $\alpha_{npn}$ or $\alpha_{pnp}$, or both will be reduced, thereby enabling $(\alpha_{npn}+\alpha_{pnp}<1)$ to be set, so that the short circuit capability can be secured.

Embodiment 3

With a semiconductor device according to Embodiment 3 of the present invention, a dopant dose in a base layer of the transistor described in the foregoing is increased in order to reduce the current amplification factors ($\alpha_{npn}$, $\alpha_{pnp}$). If the n-type dopant dose in the n-type drift layer 1, serving as the base of the pnp transistor, is increased, a switching device deteriorates in a blocking voltage. On the other hand, even if the p-type dopant dose is increased in the p-type channel layer 2, serving as the base of the npn transistor, this will hardly affect the blocking voltage, and therefore, $\alpha_{npn}$ is reduced by increasing the dopant dose in the p-type channel layer 2. According to studies carried out by the present inventor, et al., the peak value of the p-type dopant dose in the p-type channel layer 2 is preferably set to $1\times10^{18}$ cm$^{-3}$ or more in order to set $(\alpha_{npn}+\alpha_{pnp}<1)$.

Embodiment 4

Figure 4:
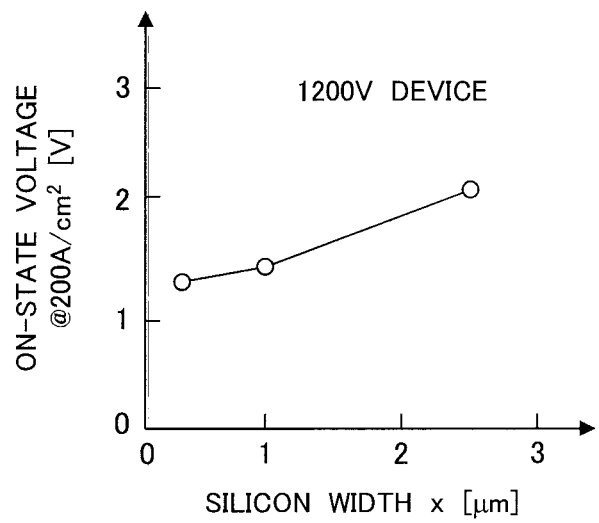
FIG. 4 is a graph showing a relationship between a silicon width and on-state voltage.
Figure 5:
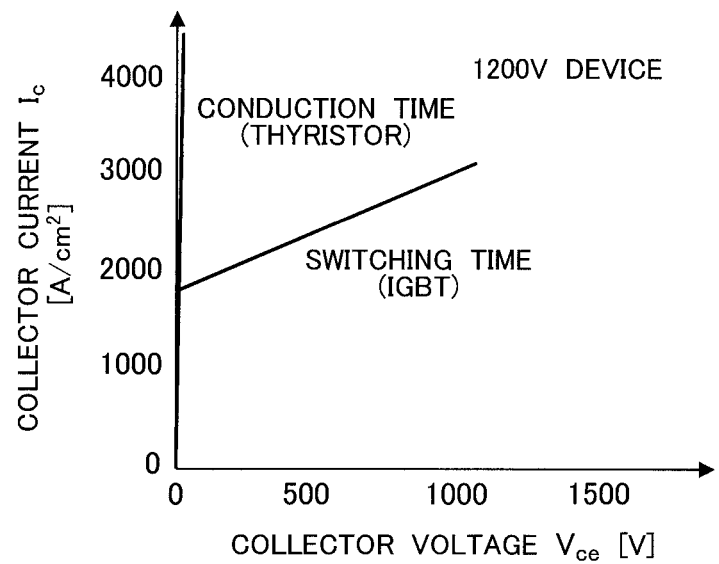
FIG. 5 is a view showing an output characteristic of the double-gate semiconductor switching element.

FIG. 4 shows a relationship between a semiconductor width, that is, the silicon width x (indicated by reference sign 20 in FIG. 1), and on-state voltage. The smaller the silicon width x is, the lower will become an on-state voltage. If the silicon width x is rendered 1 μm or less, it is possible to obtain the on-state voltage as low as 1.5V or less, lower than that of the traditional IGBT.

Embodiment 5

With Embodiments 1 through 4, the respective positions of the top end and the bottom end of the first trench-gate electrode 6 match up with those of the second trench-gate electrode 13. Now, the main function of the first trench-gate electrode 6 is to form the n-type inversion layer in an interface of the p-type channel layer 2 by application of a positive voltage to the first trench-gate electrode 6, thereby controlling ON-OFF of the semiconductor switching element. On the other hand, the main function of the second trench-gate electrode 13 is to form the p-type inversion layer in the surface of the n-type emitter layer 3 by application of a negative voltage to the second trench-gate electrode 13, further forming a path through which holes are ejected to the emitter electrode 7, thereby controlling the turn-off power loss. Accordingly, respective shapes of the first trench-gate electrode 6 and the second trench-gate electrode 13, for satisfying the respective functions, are described as follows:

(1) The top end of the first trench-gate electrode 6 is positioned above the top end of the p-type channel layer 2, and the bottom end of the first trench-gate electrode 6 is positioned below the bottom end of the p-type channel layer 2.

(2) The top end of the second trench-gate electrode 13 is positioned above the top end of the n-type emitter layer 3, and the bottom end of the second trench-gate electrode 13 is positioned below the bottom end of the n-type emitter layer 3.

Figure 2:
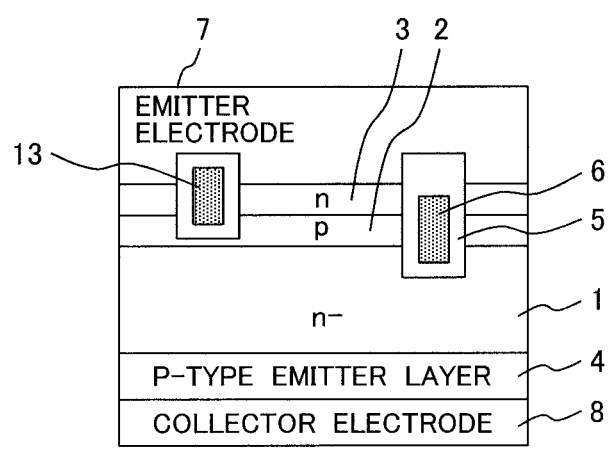
FIG. 2 is a sectional view of a semiconductor device according to Embodiment 5 of the present invention.

FIG. 2 shows a construction example of the trench-gate electrodes satisfying conditions (1), and (2) described as above, respectively.

The embodiment of FIG. 2 differs from the embodiment of FIG. 1 in that the top end of the first trench-gate electrode 6 is positioned between the top end of the n-type emitter layer 3 and the bottom end thereof, while the bottom end of the first trench-gate electrode 6 is positioned between the top end of the n-type drift layer 1 and the bottom end thereof, as is the case with the embodiment of FIG. 1. Further, the top end of the second trench-gate electrode 13 is positioned between the top end of the emitter electrode 7 and the bottom end thereof, as is the case with the embodiment of FIG. 1, whereas the bottom end of the second trench-gate electrode 13 is positioned between the top end of the p-type channel layer 2 and the bottom end thereof, in contrast to the case of the embodiment of FIG. 1.

With the embodiment of FIG. 2, a lengthwise dimension of the first trench-gate electrode 6 as well as the second trench-gate electrode 13 can be reduced, as compared with the case of the embodiment of FIG. 1. For this reason, an input capacitance of the first trench-gate electrode 6 as well as the second trench-gate electrode 13 is rendered smaller, so that a switching loss is reduced.

Embodiment 6

Figure 6:
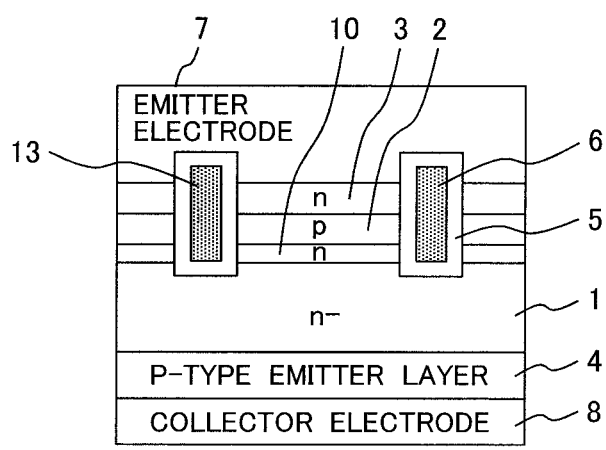
FIG. 6 is a sectional view of a semiconductor device according to Embodiment 6 of the present invention.

FIG. 6 is a sectional view of a semiconductor device according to Embodiment 6 of the present invention. The present embodiment differs from Embodiment 1 in that there is provided an n-type hole-barrier layer 10 higher in the n-type dopant dose than the n-type drift layer 1. Because the hole-barrier layer is installed, the on-state voltage can be reduced, while securing the short circuit capability as desired.

Embodiment 7

Figure 7:
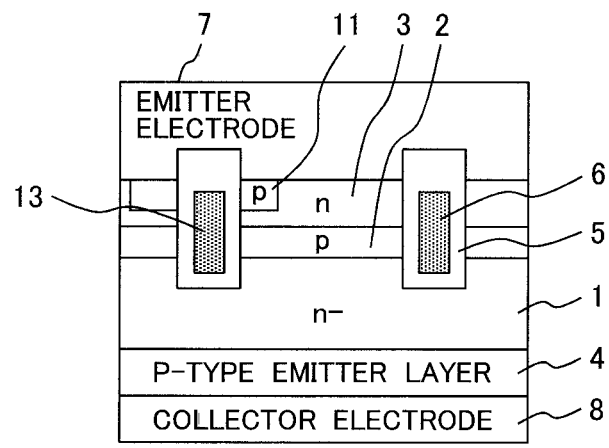
FIG. 7 is a sectional view of a semiconductor device according to Embodiment 7 of the present invention.

FIG. 7 is a sectional view of a semiconductor device according to Embodiment 7 of the present invention. The present embodiment differs from Embodiment 1 in that a p-layer 11, in contact with the gate insulator film 5 adjacent to the second trench-gate electrode 13, is provided in the n-type emitter layer 3. The p-layer 11 is electrically coupled to the emitter electrode 7 by ohmic contact. Further, the respective top ends of the first trench-gate electrode 6 and the second trench-gate electrode 13 are positioned between the top end of the n-type emitter layer 3 and the bottom end thereof, and the respective bottom ends of the first trench-gate electrode 6 and the second trench-gate electrode 13 are positioned between the top end of the n-type drift layer 1 and the bottom end thereof.

With the present embodiment, the top end of the second trench-gate electrode 13 is positioned below the top end of the n-type emitter layer 3, however, because the p-layer 11 is provided, holes are ejected to the emitter electrode 7 via the p-type channel layer 2, the inversion layer formed in the surface of the n-type emitter layer 3 sandwiched between the p-type channel layer 2 and the p-layer 11, and the p-layer 11 when the negative voltage is applied to a second gate. In consequence, the respective top ends of these trench-gate electrodes can be isolated from the emitter electrode 7, while maintaining the respective functions of the first and second trench-gate electrodes. Accordingly, it is possible to prevent a short-circuit failure from occurring between the emitter electrode 7 and each of the first and second trench-gate electrodes, so that the reliability of the semiconductor device is improved.

With the present embodiment, even if a dopant dose in the n-type emitter layer 3 is increased, the current amplification factor $\alpha_{npn}$ of the npn transistor made up of the n-type emitter layer 3, the p-type channel layer 2, and the n-type drift layer 1 can be controlled, so that the on-state voltage can be reduced by increasing the dopant dose in the n-type emitter layer 3, and by coupling the emitter electrode 7 to the n-type emitter layer 3 through ohmic contact.

Further, with the present embodiment as well, the shape and the dopant dose with respect to the n-type emitter layer 3, the p-layer 11, and the p-type emitter 4, respectively, are set in such a way as to prevent occurrence of the latch-up even in a short circuit state in order to secure the short circuit capability as desired.

Embodiment 8

Figure 8:
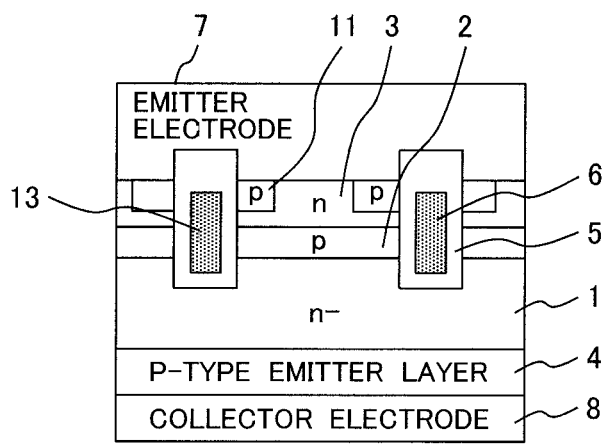
FIG. 8 is a sectional view of a semiconductor device according to Embodiment 8 of the present invention.

FIG. 8 is a sectional view of a semiconductor device according to Embodiment 8 of the present invention. A p-layer 11 is provided in the n-type emitter layer 3, on a side thereof, adjacent to the second trench-gate electrode 13, as is the case with the embodiment in FIG. 7, and a p-layer 11 in contact with the gate insulator film 5 is provided in the n-type emitter layer 3, on a side thereof, adjacent to the first trench-gate electrode 6, as well. Because the p-layer 11 is provided so as to be adjacent to the first trench-gate electrode 6, an interface between the n-type emitter layer 3 and the first trench-gate electrode 6 undergoes p-type inversion by application of a negative voltage to the first trench-gate electrode 6 when the switching device is turned OFF, so that turn-OFF is speeded up.

Further, with the present embodiment as well, the shape and the dopant dose are set with respect to the n-type emitter layer 3, the p-layer 11, and the p-type emitter 4, respectively, in such a way as to prevent occurrence of latch-up even in a short circuit state in order to secure the short circuit capability as desired.

Embodiment 9

Figure 9:
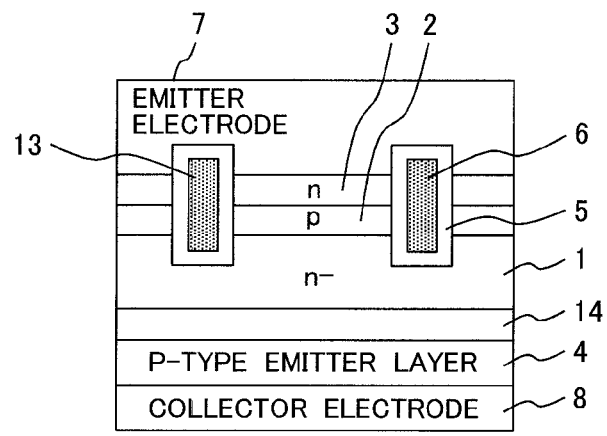
FIG. 9 is a sectional view of a semiconductor device according to Embodiment 9 of the present invention.

FIG. 9 is a sectional view of a semiconductor device according to Embodiment 9 of the present invention. With the respective embodiments described as above, the pn junction on the underside of the semiconductor device, that is, on a side thereof, adjacent to the collector electrode 8, is composed of the p-type emitter layer 4, and the n-type drift layer 1. In contrast, with the present embodiment, an n-buffer layer 14 higher in dopant dose than the n-type drift layer 1 is provided between the n-type drift layer 1 and the p-type emitter layer 4, so that a pn junction on the underside of the semiconductor device is composed of the p-type emitter layer 4, and the n-buffer layer 14.

The semiconductor device according to the present embodiment is of the so-called punch-through type, in which, a depletion layer extending in the n-type drift layer 1 from the pn junction of the p-type channel layer 2 and the n-type drift layer 1, in a voltage blocking state, will reach the n-buffer layer 14. Accordingly, the thickness of the n-type drift layer 1 can be reduced, so that the on-state voltage can be reduced, while securing the short circuit capability.

Embodiment 10

Figure 10:
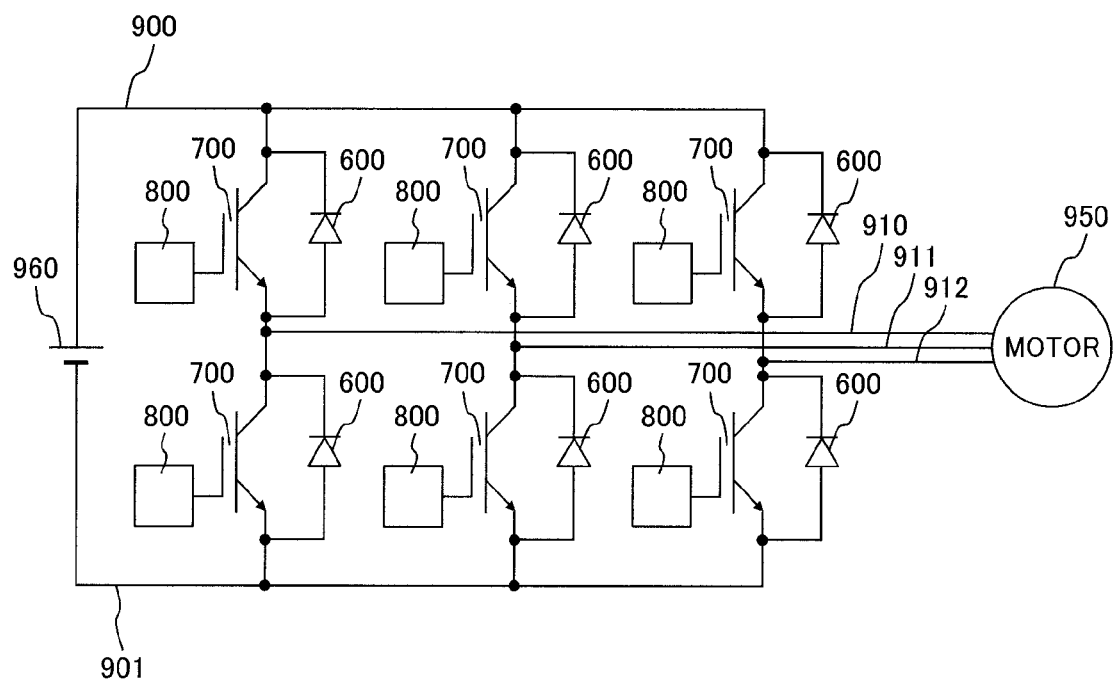
FIG. 10 is a circuit block diagram of an electric power converter.

FIG. 10 shows a circuit block diagram of an electric power converter according to Embodiment 10 of the present invention. The present electric power converter is provided with a three-phase inverter circuit for motor driving.

The three-phase inverter circuit according to the present embodiment is provided with a pair of dc terminals (900, 901), and a number of ac terminals, identical in number to the total number of alternating currents, namely, three pieces of the ac terminals (910, 911, 912). A plurality of semiconductor switching elements (700) are connected between the respective dc terminals as well as the respective ac terminals, each of the semiconductor switching elements, incorporating a diode (600) connected thereto in inverse-parallel. Further, with the present embodiment, one piece of the semiconductor switching element is connected between one of the dc terminals and one of the ac terminals, and six pieces of the semiconductor switching elements are used in the electric power converter as a whole. The semiconductor device according to each of the embodiments described in the foregoing is applied to these semiconductor switching elements. Further, in FIG. 10, as circuit signs of the semiconductor switching element, the circuit signs of the IGBT are used for convenience's sake.

More specifically, the structure of the present embodiment is as follows.

The diode 600 is connected in inverse-parallel to the semiconductor switching element 700. In other words, the diode 600 operates as a free wheeling diode. Herein, for the semiconductor switching element 700, any of the semiconductor devices according to respective embodiments of the present invention is used. Two pieces of the semiconductor switching elements 700 are connected in series to each other, and therefore, two pieces of inverse-parallel circuits, each thereof being composed of the semiconductor switching element 700 and the diode 600, are connected in series to each other, thereby forming a half-bridge circuit corresponding to one phase. A number of the half-bridge circuits, corresponding in number to the number of ac phases, that is, three units of the half-bridge circuits are provided in the case of the present embodiment. A U-terminal 910, a V-terminal 911, and a W-terminal 912, serving as respective AC terminals for a U-phase, a V-phase, and a W-phase, are extended from a series-connection node of the two pieces of the semiconductor switching elements 700, in other words, a series-connection node of the two pieces of the inverse-parallel circuits, and the respective ac terminals are connected to a motor 950 such as an induction motor, a synchronous motor, etc. The collector electrodes on a side of the respective semiconductor switching elements 700, adjacent to an upper arm, are connected in common with each other to be connected to the P-terminal 900 on a high potential side of a dc power supply 960. Further, the emitter electrodes on a side of the respective semiconductor switching elements 700, adjacent to a lower arm, are connected in common with each other to be connected to the N-terminal 901 on a low potential side of the dc power supply 960. With the present electric power converter, ON and OFF switching of the respective semiconductor switching elements 700 are executed by the gate control signal outputted by a gate circuit 800, thereby converting a dc electric power received from the dc power supply 960 into an ac electric power. The motor 950 is driven by the ac electric power.

In the inverter circuit of FIG. 10, lower power loss of the inverter circuit and miniaturization thereof can be realized by application of the semiconductor device according to any of the embodiments of the present invention serving as the semiconductor switching element.

Further, even with an inverter circuit provided with a number of the half-bridge circuits, corresponding in number to the number of ac phases, without limitation to the case of the three-phase inverter circuit, the lower power loss of the inverter circuit, and the miniaturization thereof can be achieved by application of the semiconductor device according to any of the embodiments serving as the semiconductor switching element of the present invention.

Furthermore, similar advantageous effects can be obtained by application of the semiconductor device according to any of the embodiments of the present invention serving as the semiconductor switching element to a converter for converting an ac electric power into a dc electric power.

Still further, the present invention is applicable to the semiconductor device according to any of the embodiments of the present invention, in which respective semiconductor layers of the semiconductor device are reversed in conductivity type.

REFERENCE SIGNS LIST

1 . . . n-type drift layer,
2 . . . p-type channel layer,
3 . . . n-type emitter layer,
4 . . . p-type emitter layer,
5 . . . gate insulator film,
6 . . . first trench-gate electrode,
7 . . . emitter electrode,
8 . . . collector electrode,
10 . . . n-type hole-barrier layer,
11 . . . p-layer,
13 . . . second trench-gate electrode,
14 . . . n-buffer layer,
31 . . . IGBT,
32 . . . variable resistor,
33, 34 . . . buffer circuit,
35 . . . control circuit,
36 . . . micon,
37 . . . drive circuit
38 . . . first gate voltage signal,
39 . . . second gate voltage signal,
600 . . . free wheeling diode,
700 . . . semiconductor switching element,
800 . . . gate circuit,
900 . . . P-terminal,
901 . . . N-terminal,
910 . . . U-terminal,
911 . . . V-terminal,
912 . . . W-terminal,
950 . . . motor,
960 . . . do power supply

The invention claimed is:

1. A semiconductor device comprising:
a first emitter layer of a first conductivity type;
a drift layer of a second conductivity type, adjacent to the first emitter layer;
a channel layer of the first conductivity type, adjacent to the drift layer;
a second emitter layer of the second conductivity type, adjacent to the channel layer;
a collector electrode electrically coupled to the first emitter layer;
an emitter electrode electrically coupled to the second emitter layer;
a first trench-gate electrode for controlling on and off of an electric current flowing between the collector electrode and the emitter electrode, and
a second trench-gate electrode for controlling a turn-off power loss, the semiconductor device including a thyristor unit made up of the first emitter layer, the drift layer, the channel layer, and the second emitter layer,
wherein the electric current has saturation characteristics in a short circuit state.

2. The semiconductor device according to claim 1, wherein an off-gate voltage signal is imparted to the second trench-gate electrode before the off-gate voltage signal is imparted to the first trench-gate electrode at a time when the semiconductor device is turned off.

3. The semiconductor device according to claim 1, wherein a dopant dose of the first conductivity type, in the first emitter layer, is $1\times10^{18}$ cm$^{-3}$ or less.

4. The semiconductor device according to claim 1, wherein a dopant dose of the second conductivity type, in the second emitter, is $1\times10^{18}$ cm$^{-3}$ or less.

5. The semiconductor device according to claim 1, wherein a dopant dose of the first conductivity type, in the channel layer, is $1\times10^{18}$ cm$^{-3}$ or more.

6. The semiconductor device according to claim 1, wherein a width of a semiconductor layer between the first trench-gate electrode and the second trench-gate electrode is 1 μm or less.

7. The semiconductor device according to claim 1, wherein the top end of the first trench-gate electrode is positioned above the top end of the channel layer, and the bottom end of the first trench-gate electrode is positioned below the bottom end of the channel layer, whereas the top end of the second trench-gate electrode is positioned above the top end of a region of the second emitter layer, and the bottom end of the second trench-gate electrode is positioned below the bottom end of the region of the second emitter layer.

8. The semiconductor device according to claim 1, wherein a hole-barrier layer of the second conductivity type, higher in the second conductivity type dopant dose than the drift layer, is provided between the drift layer and the channel layer.

9. The semiconductor device according to claim 1, wherein a semiconductor region of the first conductivity type, adjacent to the second trench-gate electrode, is provided in the second emitter layer, and the semiconductor region is electrically coupled to the emitter electrode.

10. An electric power converter comprising:
a pair of dc terminals;
a number of ac terminals, identical in number to the total number of ac phases, the electric power converter including a plurality of semiconductor switching elements connected between the respective dc terminals as well as between the respective ac terminals,
wherein the semiconductor switching element is the semiconductor device according to claim 1.

* * * * *